United States Patent [19]
Klauck

[11] 4,034,268
[45] July 5, 1977

[54] SPEAKER PROTECTION CIRCUIT

[75] Inventor: David E. Klauck, St. Joseph, Mich.

[73] Assignee: Heath Company, Benton Harbor, Mich.

[22] Filed: Nov. 10, 1975

[21] Appl. No.: 630,598

[52] U.S. Cl. .......................... 361/111; 330/207 P; 361/88

[51] Int. Cl.² ........................................ H02H 3/00

[58] Field of Search ............... 330/207 P; 179/1 A; 317/33 R, 36 TD, 31, 50

[56] References Cited

UNITED STATES PATENTS

| | | |
|---|---|---|
| 3,691,427 | 9/1972 | Honda et al. ............. 330/207 P X |
| 3,835,412 | 9/1974 | Honda et al. ................. 330/207 P |
| 3,965,295 | 6/1976 | Evans et al. ................. 317/33 R X |

FOREIGN PATENTS OR APPLICATIONS

| 20,601 | 7/1966 | Japan ............................ 330/207 P |

Primary Examiner—Harry E. Moose, Jr.

Attorney, Agent, or Firm—William R. Sherman; Kevin McMahon; Joseph J. Kaliko

[57] ABSTRACT

A circuit for protecting speakers connected to the output of an audio amplifier. The output of the amplifier is connected to a filter which blocks normal audio frequency signals but passes both high and low frequency signals outside the normal audio range. The positive and negative filter output signals are connected respectively to the inverting and non-inverting inputs of an operational amplifier whose output is connected via a turn-on delay circuit to a speaker relay, which, when closed, connects the speaker to the amplifier. The turn-on delay circuit prevents speaker relay closure until turn-on transients have ended. If a DC voltage or a high frequency signal is present at the amplifier output, the operational amplifier generates a signal to open the relay thereby disconnecting the speaker from the amplifier output. The speaker relay quickly opens when power is turned off so that amplifier turn-off transients are not connected to the speaker either.

26 Claims, 2 Drawing Figures

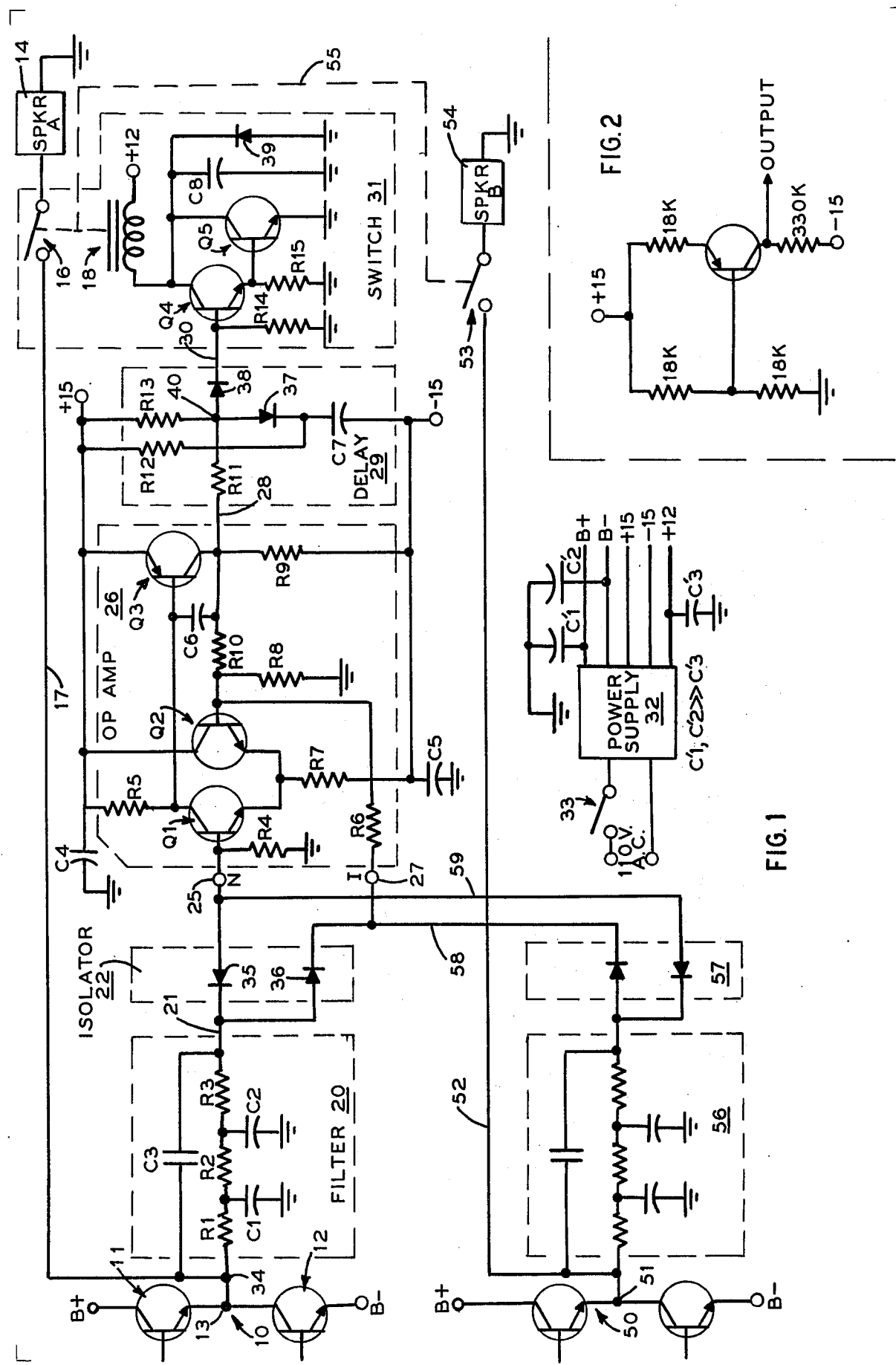

SPEAKER PROTECTION CIRCUIT

BACKGROUND OF THE INVENTION

This invention relates generally to audio amplifiers and, more particularly, to circuits for protecting speakers from damage caused by DC voltage imbalance of the amplifier, high frequency signals, turn-on or turn-off transients, and the like.

The advent of transistor technology has permitted the design of audio amplifiers having speakers which are DC connected to the amplifier output. Amplifiers of this type have many advantages, however, they also have many problems which heretofor have not been solved satisfactorily. For example, amplifier turn-on and turn-off transients, if connected to the speaker, produce an annoying thump that can damage a speaker. In addition, component failure or aging can cause a non-zero quiescent output voltage to develop which produce a direct current through the connected speaker coil which, if sufficiently large, will cause damage to or even destroy it. Some amplifier failures produce high frequency oscillations which may damage both the amplifier and speaker.

In attempting to overcome some of the above mentioned problems, protective circuits have been designed which, on detecting a DC voltage at the amplifier output terminal, shorts the amplifier output to ground thereby by-passing the speaker. This approach, however, can cause a large current to flow in the amplifier output transistors which could cause them to burn out.

Another frequently employed approach is to provide a circuit which disconnects the speaker from the amplifier output if a DC output voltage of sufficient magnitude is present. Known circuits of this type, however, have not provided isolation between different channels of an amplifier system so that, under certain circumstances, it is possible that a failure in more than one channel could occur simultaneously and the protection circuit would fail to protect the speakers on these channels. Additionally, a protection circuit of this type does not prevent either the thumping noise or possible damage resulting from turn-on or turn-off amplifier transients nor does it address the problem of spurious high frequency output signals.

OBJECTS AND SUMMARY OF THE INVENTION

In view of the foregoing difficulties associated with prior art speaker protection circuits, it is a primary objective of the invention to provide a speaker protection circuit for audio amplifiers which prevents speaker damage resulting from the presence of either DC or high frequency signals at the amplifier output.

It is another objective of the invention to provide a speaker protection circuit which prevents speaker damage due to DC or high frequency signals at the amplifier output and also prevents transient currents from passing through the speaker during amplifier turn-on or turn-off.

It is yet a further objective of the invention to provide a speaker protection circuit for an audio amplifier which is inexpensive but reliable and prevents speaker damage due to DC, high frequency or transient signals at the amplifier output.

It is still a further objective of the invention to provide a speaker protection circuit connectable to a plurality of audio amplifiers which will prevent speaker damage due to DC, high frequency or transient signals at any connected amplifier output.

In accordance with these and other objects of the invention, a protection circuit is provided for protecting a speaker directly connected to an audio amplifier by disconnecting the speaker whenever a signal outside the normal audio range is present at the amplifier output.

The circuit includes a filter connected to the amplifier output which passes signals outside the normal audio range. The passed signals connect to the input of an operational amplifier whose output connects via a turn-on delay circuit to a speaker relay. The speaker relay opens when signals outside the normal audio range are present at the amplifier output thereby disconnecting the speaker.

DESCRIPTION OF THE DRAWINGS

The foregoing objects, features and advantages of the present invention will become more fully apparent from the following detailed description of a preferred embodiment and the drawings which forms a part of the original disclosure wherein;

FIG. 1 is a schematic diagram of an embodiment of the speaker protection circuit.

FIG. 2 is a schematic diagram of an alternative current source used in the protective circuit.

GENERAL DESCRIPTION

Referring first to FIG. 1, the final output stage 10 of a typical directly coupled audio amplifier includes two transistors 11 and 12 connected in a push-pull configuration with the amplifier output terminal 13 being disposed between the emitter of transistor 11 and the collector of transistor 12. For amplifiers of this type, the output terminal 13 is usually connected directly to one terminal of a speaker while the other speaker terminal is connected to the amplifier ground. The speaker 14 is connected via a normally open relay switch 16 and a wire 17 to the amplifier output 13. The other terminal of the speaker 14 is connected to ground. The speaker 14 is connected to the amplifier output 13 whenever sufficient current flows through the relay coil 18 to cause the relay switch 16 to close.

In accordance with the invention, the amplifier output 13 is also connected to the input of a filter 20 which passes amplifier output signals outside the normal audio band but blocks signals within it. As used in this patent application, the term normal audio band comprises signals having frequencies lying between approximately 20 Hz and 20,000 Hz. Signals lying significantly outside the normal audio band are more easily passed by the filter 20 while signals outside but close to the normal audio band are attenuated by the filter 20.

The output 21 of the filter is connected to an isolation circuit 22 which separates the positive filter output voltages from the negative filter output voltages and connects them to the inverting and non-inverting inputs 27 and 25 respectively of an opertional amplifier 26 which functions as a detector. The operation amplifier 26 provides a low voltage level at its output 28 whenever the voltage at either input 25 or 27 has a magnitude greater than a given magnitude.

The operational amplifier output 28 is connected to a turn-on delay circuit 29. After the amplifier 10 is turned on, the turn-on delay circuit 29 keeps its output 30 at a low voltage for a delay period which prevents the relay 18 from closing to connect the speaker 14 to the audio amplifier output 13. The delay period is long enough so that power-on transients at the audio amplifier output 13 will subside before the speaker 14 is connected to the amplifier output 13. Negative going inputs from the operational amplifier 26 after the delay period also cause the output of the delay circuit 29 to go low thereby causing the relay switch 16 to open.

The output 30 of the turn-on delay circuit 29 is connected to a speaker switch circuit 31 which is responsive to a high level input voltage to close the relay switch 16 thereby connecting the speaker 14 to the amplifier output 13.

The speaker protection circuit of the illustrated embodiment of the invention and the amplifier 10 to which is connected are both powered by a power supply 32 which is turned on and off by a switch 33. When the switch 33 is turned to its off position, the supply voltage to the protective circuit falls quickly compared to the voltage supplied to the amplifier 10 so that the relay switch 16 will open to disconnect the speaker 14 from the amplifier output 13 before output transients are generated by the amplifier 10 due to the falling voltage from the power supply 32 to the amplifier 10.

DETAILED DESCRIPTION

Filter Network

The filter network 20 comprises a pair of cascaded low pass filters and a high pass filter. The two low pass filters include the resistors R1 and R2 and the capacitors C1 and C2. The high pass filter includes the resistor R3 and the capacitor C3. The electrical values for the resistors R1 and R2 and the capacitors C1 and C2 are selected so that DC and AC signals significantly below 20Hz in frequency, i.e. below 2Hz, are passed to the filter output line 21. The electrical values for R3 and C3 are selected so that signals significantly above 20,000 Hz, i.e. above 200,000 Hz are also passed to the output line 21. As such, the filter 20 blocks signals in the normal audio band between 20Hz and 20,000 Hz while passing signals significantly outside the normal audio band to the filter output line 21.

The output 21 of the filter network 20 is connected to an isolator circuit 22. This circuit comprises two diodes 35 and 36 which connect respectively between the filter network output 21 and the non-inverting and the inverting inputs 25 and 27 of the operational amplifier 26 to conduct negative signals at the filter output 21 to the non-inverting input 25 and to conduct positive signals 21 to the inverting input 27.

The operational amplifier 26 includes three transistors Q1, Q2 and Q3 which are connected in combination with several resistors and capacitors in a well known operational amplifier configuration. The component values for the operational amplifier 26 are selected so that Q1, Q2 and Q3 are normally conducting and the voltage at the collector of Q3 is approximately 0 volts. As the voltage at the non-inverting input decreases or as the voltage at the inverting input increases, the voltage at the collector of Q3 decreases. Eventually, the Q3 collector voltage falls sufficiently so that the voltage at 40 is less than 1.8 volts and transistors Q4 and Q5 are turned off thereby causing the speaker 14 to be disconnected from the amplifier 10 because the relay coil 18 is de-energized, opening the relay switch 16. For the circuit component values listed below, the operational amplifier 26 causes the relay coil 18 to de-energize when the absolute magnitude of the signal outside the normal audio range at point 13 exceeds 7 volts. This 7 volt threshold is arbitrarily selected and selection of different circuit component values will cause a shift in the threshold with the value for the feedback resistor R10 having the greatest effect on the threshold level.

The output 28 of the operational amplifier 26 is connected to the turn-on delay circuit 29 which prevents the speaker switch circuit 31 from closing switch 16 until after turn-on transient signals should have subsided at the amplifier output 13. When the amplifier is turned on by closing switch 33 the voltage of the power supply 32 terminals labeled B+, B−, +15, −15 and +12 quickly builds up to their quiescent values. At the same time, the voltage across capacitor C7 gradually builds up from zero volts to about 30 volts. Consequently, the voltage at the connection point between capacitor C7 and the diode 37 builds up from −15 volts to about +15 volts. When the voltage at the connection point between C7 and diode 37 reaches about +1.8 volts, the diode 37 becomes back biased and the diode 38, the base-emitter junction of Q4 and the base-emitter junction of Q5 become forward biased causing Q4 and Q5 to conduct.

Before the diode 37 becomes reverse biased, the capacitor C7 is charged through R11, R12, and R13. After diode 37 becomes reverse biased, however, the capacitor C7 is charged through R12 so that the diode 37 will not conduct until after the capacitor C7 is discharged following the turn off of power supply 32. This circuit action causes the voltage at 40 to remain below +1.8 volts for a period of time following the turn on of power supply 32 determined by the RC time constant of R11, R12, R13 and C7, which, for the circuit values set forth in the table below, is approximately 10 seconds. This delay of about 10 seconds assures that the switch 16 closes after turn-on transient signals at the amplifier output 13 have subsided. Thereafter, the delay circuit 29 has no effect on the overall operation of the system as the voltage across C7 reverse biases diode 37 and the voltage at 40 remains above +1.8 volts provided that the signals at the amplifier output 13 outside the normal audio range have a magnitude less than the threshold voltage of the operational amplifier 26. Should the magnitude of the signals at the amplifier output 13 outside the normal audio band rise to the threshold voltage, then the output voltage at 28 would fall sufficiently to cause the voltage at 40 to go below +1.8 volts.

The speaker switch circuit 31, in the illustrated embodiment of the invention, comprises two transistors Q4 and Q5 whose collector terminals are each connected to the relay coil 18. These two transistors Q4 and Q5 will conduct so long as the voltage at the base of Q4 is above +1.2 volts which occurs when the voltage at point 40 is above +1.8 volts. Transistors Q4 and Q5 are selected to draw sufficient current through the relay coil 18 to close the switch 16 and can be replaced, if desired, by a single transistor with sufficient current carrying capacity to accomplish the same result. The illustrated two transistor embodiment, however, requires less base drive from the delay circuit 29 than an equivalent one transistor embodiment.

The collector terminal of the transistors Q4 and Q5 are shunted to ground by a capacitor C8 and a diode 39. These shunting elements are provided to protect the transistors Q4 and Q5 from damage which might be caused by a high voltage developed across the relay coil 18 when the transistor Q4 and Q5 are turned off.

While the illustrated embodiment of the speaker switch circuit 31 employs two transistors and a relay, it will be recognized by those skilled in the art that other switching arrangements can be employed to connect or disconnect the speaker 14 from the amplifier output 13 in response to the signals at point 40 in the delay current 20.

The speaker switch circuit 31 also disconnects the speaker 14 from the amplifier output 13 when power is turned off by opening switch 33. Preferably, the +12 volt output of the power supply 32 which powers the switch circuit 31 is lightly filtered in comparison to the heavily filtered B+ and B− outputs which power the amplifier 10. In other words, the filter capacitor C3' connected to the +12 volt output terminal is much smaller than the filter capacitor C1' and C2' at the B+ and B− outputs of the power supply 32. Thus, when the power supply 32 is turned off, the +12 volt power supply output drops to zero more quickly than the B+ and B− outputs thereby causing the relay 18 to become deactivated before turn-off transients develop at the output 13. Consequently, the circuit shown in FIG. 1 prevents turn-off transients from reaching the speaker 14 thereby preventing possible speaker damage or thumping.

Typical values for the circuit components of the illustrated embodiment are shown below in Table 1.

TABLE 1

| R1 | 68K | C1 | 4ufd. |
|----|-----|----|-------|
| R2 | 68K | C2 | 4ufd. |
| R3 | 1200 | C3 | 47pfd. |
| R4 | 10K | C4 | .05ufd. |
| R5 | 4700 | C5 | .05ufd. |
| R6 | 10K | C6 | 47pfd. |
| R7 | 47k | C7 | 500ufd. |
| R8 | 10k | | |
| R9 | 10k | | |
| R10 | 100k | | |
| R11 | 15k | | |
| R12 | 100k | | |
| R13 | 33k | | |
| R14 | 15k | | |
| R15 | 4.7k | | |

While the foregoing table shows the component values preferred by applicant, it is clear that variations in the values of particular components may be appropriate to optimize the particular circuit according to the invention for use in a particular audio system.

In one alternative embodiment of the invention, the resistor R12 in FIG. 1 can be replaced by the current source of FIG. 2. The output of this current source is connected between the diode 37 and the capacitor C7 while the other components are connected as shown. Both R12 of the current source of FIG. 2 are provided in the circuit in order to maintain the voltage across the capacitor C7 high enough to back bias diode 37 once the delay time has elapsed. For capacitors with a low leakage current, a resistor such as R12 is adequate. However, for capacitors with rather high leakage current but relatively low cost, a current source like that of FIG. 2 is more desirable because diode 37 will remain back biased due to maintaining a charge on capacitor C7. To accomplish this result with a single resistor, the value of R12 must be reduced which affects the delay time. The current source of FIG. 2 has a high impedance as compared to resistor R12 and, consequently, the current source has little effect on the delay time which is principally controlled by the charge time of C7 through resistors R11 and R13.

The circuit according to the invention is capable of protecting a plurality of speakers connected to a plurality of audio amplifier channels. For example, the output stage 50 of a second audio amplifier includes an output terminal 51 connected via a wire 52 through a relay switch 53 to a second speaker 54. The relay switch 53, as indicated by the dotted line 55, is magnetically coupled to the relay coil 18 and is closed whenever the switch 16 is also closed.

The second amplifier output 51 is connected to a second filter network 56 which is identical to and functions the same as the filter 20.

The output of the filter network 56 is connected to an isolator 57 identical to and functions the same as the isolator 22. The negative output of the isolator 57 is connected via a wire 59 to the non-inverting input of the operatinal amplifier 26 while the positive output is connected via a wire 58 to the inverting input. The protection circuit operates to protect the speaker 54 from transient or spurious signals present at the amplifier output 51 in the same manner as it protects speaker 14 from such signals at the amplifier output 13.

It is clear that protection of additional speakers coupled to other audio amplifier channels can be provided merely by adding an additional filter network, such as 56, an isolator circuit, such as 57, and a relay switch, such as 53, which is actuated by the relay coil 18. With such a system, however, a spurious signal at the output of any coupled audio amplifier, which turns off transistors Q4 and Q5, disconnects all the speakers from their respective audio amplifiers. On the other hand, if individual control is desirable and the added cost acceptable, the entire protection circuit can be duplicated for each audio channel.

While the invention has been described with reference to one examplary embodiment, it will be readily recognized by those skilled in the art tht many modifications may be made without departing from the spirit and scope of the invention as defined in the claims. For instance, other filter networks with similar transfer functions can be substituted for filter 20. Also, other circuit configurations can be substituted for the switch circuit 31 and the threshold voltage at which the switch circuit 31 disconnects the speaker from the amplifier output can be modified.

What is claimed is:

1. In a system including an audio amplifier with an output, a power supply for powering the audio amplifier, the power supply including means to turn the power supply on or off, and a speaker, a protection circuit to prevent connection of the speaker to the amplifier output whenever turn-on or turn-off transients or signals outside the normal audio band are present at the amplifier output comprising, in combination:

a filter network connected to the amplifier output, said filter network being operative to block signals within the normal audio band and pass signals both above and below the normal audio frequency band;

an isolation circuit responsive to the signals passed by said filter network for separating the passed signals into a positive and a negative component;

detector means responsive to both said positive and said negative component for producing a control signal whenever the magnitude of either said positive or said negative component is below a given magnitude;

delay circuit means powered by the power supply for passing said control signal following a delay time after the power supply is turned on; and a switching circuit powered by the power supply and responsive to said passed control signal from said delay circuit for connecting the speaker to the amplifier output, said switching circuit and power supply, in combination, being operative to disconnect the speaker from the amplifier output before turn off transients appear at the amplifier output when the power supply is turned off.

2. The protection circuit of claim 1 wherein said filter network includes a low pass filter for passing very low frequency signals to the filter network output and a high pass filter for passing very high frequency signals to the filter network output, said filter network being operative to prevent feedthrough of signals within the normal audio frequency range.

3. The protection circuit of claim 1 wherein said isolation circuit comprises at least two diodes wired to separate the positive and the negative components of the filter network output signal.

4. The protection circuit of claim 1 wherein said detector means comprises an operational amplifier with its non-inverting input connected to receive said negative component and its inverting input connected to receive said positive component.

5. In a system including an audio amplifier with an output, a power supply for powering the audio amplifier, the power supply including means to turn the power supply on or off, and a speaker, a protection circuit to prevent connection of the speaker to the amplifier output whenever turn-on or turn-off transients or signals outside the normal audio frequency range are present at the amplifier output comprising, in combination:

a filter network connected to the amplifier output, said filter network being operative to block signals within the normal audio frequency range and pass signals both above and below the normal audio frequency range;

an isolation circuit responsive to the signals passed by said filter network for separating the passed signals into a positive and a negative component;

detector means responsive to both said positive and said negative component for producing a control signal whenever the magnitude of either said positive or said negative component exceeds a selectable magnitude;

delay circuit means powered by the power supply for producing a switching signal below one level for a predetermined delay time after the power supply is turned on and producing a switching signal at least at said one level after said delay time has elapsed, said delay circuit responding to said control signal to produce a switching signal below said one level;

a switching circuit powered by the power supply and responsive to said switching signal for connecting the speaker to the amplifier output whenever said switching signal is at least at said one level and for disconnecting the speaker from the amplifier output whenever said switching signal is below said one level, said switching circuit and power supply, in combination, being operative to quickly disconnect the speaker from the amplifier output when the power supply is turned off.

6. The protection circuit of claim 5 wherein said filter network includes a low pass filter for passing very low frequency signals to the filter network output and a high pass filter for passing very high frequency signals to the filter network output, said filter network being operative to prevent feedthrough of signals within the normal audio frequency range.

7. The protection circuit of claim 5 wherein said isolation circuit comprises at least two diodes wired to separate the positive and the negative component of the filter network output signal.

8. The protection circuit of claim 5 wherein said detector means comprises an operational amplifier with its non-inverting input connected to receive said negative component and its inverting input connected to receive said positive component.

9. In a system including at least two audio amplifiers with each amplifier having an output power supply powering each of the audio amplifiers including means to simultaneously turn the power on or off at each amplifier, and a speaker associated with each amplifier, a protection circuit to prevent connection of each speaker with the associated amplifier whenever turn-on transients, turn-off transients, or signals outside the normal audio frequency range are present at least at one amplifier output comprising, in combination:

a filter network connected to each amplifier output, each said filter network being operative to block signals within the normal audio frequency range and pass signals both above and below the normal audio band to a filter network output;

an isolation circuit connected to each said filter network output and responsive to the signals passed thereby for separating the passed signals into a positive and a negative component;

detector means responsive to both said positive and said negative component from each said isolation circuit for producing a control signal whenever the magnitude of said positive or said negative component from any said isolation circuit exceeds a selectable magnitdue;

delay circit means powered by the power supply for producing, after a predetermined delay time after the power supply is turned on, a switching signal, said delay circuit responding to said control signal to block said switching signal;

a switch circuit powered by the power supply and responsive to said switching signal for connecting each speaker to its associated amplifier output, said switch circuit and the power supply, in combination, being operative to disconnect each speaker from its associated amplifier output before turn-off transients occur at any amplifier output when the power supply is turned off.

10. The protection circuit of claim 9 wherein each said filter network comprises a low pass filter for passing very low frequency signals outside the normal audio frequency range and a high pass filter for passing signals above the normal audio frequency range, each said filter network being operative to prevent feedthrough of signals in the normal audio frequency range.

11. The protection circuit of claim 9 wherein each said isolation circuit includes at least two diodes wired to separate the signals received from the connected filter network into its positive and its negative component.

12. The protection circuit of claim 9 wherein said detector means comprises an operational amplifier with the non-inverting input electrically connected to receive the negative component from each isolation circuit and the inverting input of said operational amplifier being wired to receive the positive component from each said isolation circuit.

13. The protection circuit of claim 9 wherein the power supply includes a lightly filtered power output for powering said switch circuit, said lightly filtered output being turned on and turned off simultaneously with the audio amplifier, said lightly filtered output being operative to quickly drop to zero when the audio amplifier is turned off so that said switch circuit will quickly disconnect the speaker from the audio amplifier to prevent turn-off transients at the amplifier output from being connected to the speaker.

14. In a system including at least two audio amplifiers with each amplifier having an output, power supply powering each of the audio amplifiers including means simultaneously turn the power on or off at each amplifier, and a speaker associated with each amplifier, a protection circuit to prevent connection of each speaker to the associated amplifier whenever turn-on transients, turn-off transients or signals outside the normal audio frequency range are present at least at one amplifier output comprising, in combination:
- a filter network connected to each amplifier output, each said filter network being operable to block signals inside the normal audio frequency range and pass signals both above and below the normal audio band to a filter network output;
- an isolation circuit connected to each said filter network output and responsive to the signals passed thereby for separating the passed signals into a positive and a negative component;
- detector means responsive to both said positive and said negative component at each said isolation circuit output for producing a control signal whenever the magnitude of said positive or said negative component from any said isolation circuit exceeds a selectable magnitude;
- delay circuit means powered by the power supply for producing a switching signal below one level for a predetermined delay time after the power supply is turned on and producing a switching signal at least at said one level after said delay time has elapsed, said delay circuit responding to said control signal to produce a switching signal below said one level;
- a switch circuit powered by the power supply and responsive to said switching signal for connecting each speaker to its associated amplifier output whenever said switching signal is at least at said one level and for disconnecting each speaker from its associated amplifier output whenever said switching signal is below said one level, said switch circuit and said power supply means, in combination, being operative to quickly disconnect each said speaker from its associated amplifier output before turn-off transients develop at any amplifier output when the power supply means removes power from each amplifier.

15. The protection circuit of claim 14 wherein each said filter network comprises a low pass filter for passing very low frequency signals below the normal audio frequency range and a high pass filter for passing signals above the normal audio frequency range.

16. The protection circuit of claim 14 wherein each said isolation circuit includes at least two diodes wired to separate the signals received from the connected filter network into a positive and a negative component.

17. The protection circuit of claim 14 wherein said detector means comprises an operational amplifier with the non-inverting input electrically connected to receive the negative component from each isolation network and the inverting input of said operational amplifier being wired to receive the positive component from each said isolation circuit.

18. The protection circuit of claim 14 wherein the power supply includes a lightly filtered power output for powering said switch circuit, said lightly filtered output being turned on and turned off simultaneously with the audio amplifier, said lightly filtered output being operative to quickly drop to zero when the audio amplifier is turned off so that said switch circuit will quickly disconnect the speaker from the audio amplifier before the amplifier itself begins to turn off so that turn-off transients at the amplifier output are not connected to the speaker.

19. The protection circuit of claim 1 wherein the power supply includes a lightly filtered power output for powering said switch circuit and a heavily filtered output for powering the amplifier, said lightly filtered output being turned on and turned off simultaneously with the audio amplifier, said lightly filtered output being operative to quickly drop to zero when the power supply is turned off and before the amplifier turns off so that said switch circuit will quickly disconnect the speaker from the audio amplifier output and prevent turn-off transients at the amplifier output from being connected to the speaker.

20. In a system including an audio amplifier with an output, a power supply for powering the audio amplifier, the power supply including means to turn the power supply on or off and a speaker, a protection circuit to prevent connection of the speaker to the amplifier output whenever turn-on or turn-off transients or signals outside the normal audio frequency range are present at the amplifier output comprising, in combination:
- a filter network connected to the amplifier output, said filter network including a low pass section and a high pass section to block signals within the normal audio frequency range and pass signals outside the normal audio frequency range;
- an isolation circuit including at least two unidirectional current conducting elements responsive to the signals passed by said filter network for separating the passed signals into a positive and a negative component;
- operational amplifier means having its non-inverting input wired to receive said negative component and its inverting input wired to receive said positive component, said operational amplifier producing a control signal at its output whenever the magnitude of either said positive or said negative component exceeds a selectable magnitude;
- delay circuit means responsive to the power supply being turned on for producing a switching signal below one level for a predeterined delay time after the power supply is turned on and producing a switching signal at least at said one level after said delay time has elapsed, said delay circuit responding to said control signal to produce a switching signal below said one level; and
- a switch circuit powered by the power supply and responsive to said switching signal for connecting the speaker to the amplifier output whenever said switching signal is at least at said one level and for disconnecting the speaker from the amplifier output whenever said switching signal is below said one level, said switch circuit and the power supply, in combination, being operative to disconnect the speaker from the amplifier output before turn-off transients are generated by the amplifier when the power supply is turned off.

21. A speaker protection circuit for protecting a speaker from audio amplifier output signals above and below the normal audio band comprising, in combination:

switch means connected in series between the output of the amplifier and the speaker;

filter means connected to the amplifier output for passing only said output signals;

means sensitive to passed signals above a given magnitude for opening said switch means to disconnect the speaker from the amplifier ; and turn-on delay means for holding said switch means open for a delay time following the application of power to the amplifier until turn-on transients at the amplifier output subside.

22. The protection circuit of claim 21 wherein said filter means includes a low pass filter for passing very low frequency signals below the normal audio band and a high pass filter for passing very high frequency signals above the normal audio band, said filter means operative to block passing of signals in the normal audio band.

23. The protective circuit of claim 21 wherein said means sensitive to passed signals includes means for opening said switch means prior to the production of turn-off transients at the amplifier output following removal of power from the amplifier.

24. The protective circuit of claim 21 additionally including a power supply with a plurality of power outlets, the power supply outlet for said means sensitive to passed signals being lightly filtered compared to the power outlet for the audio amplifier, the voltage at the first mentioned power outlet falling faster than the voltage at the second mentioned power outlet so that said switch means is opened before turn-off transients are developed at the amplifier output.

25. The protective circuit of claim 21 wherein said means sensitive to passed signals includes an isolator circuit for separating the passed signals into both a positive and a negative component.

26. The protective circuit of claim 21 wherein said means sensitive to passed signals additionally includes an operational amplifier with its inverting input wired to receive said positive component and said noninverting input wired to receive said negative component.

* * * * *